(12) United States Patent
Li

(10) Patent No.: US 9,791,758 B2
(45) Date of Patent: Oct. 17, 2017

(54) DISPLAY SUBSTRATE AND MANUFACTURING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Tiansheng Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/908,673

(22) PCT Filed: Jul. 20, 2015

(86) PCT No.: PCT/CN2015/084438
§ 371 (c)(1),
(2) Date: Jan. 29, 2016

(87) PCT Pub. No.: WO2016/145758
PCT Pub. Date: Sep. 22, 2016

(65) Prior Publication Data
US 2017/0038622 A1 Feb. 9, 2017

(30) Foreign Application Priority Data
Mar. 13, 2015 (CN) .......................... 2015 1 0112481

(51) Int. Cl.
*H01L 29/417* (2006.01)
*G02F 1/1368* (2006.01)
(Continued)

(52) U.S. Cl.
CPC ............ *G02F 1/1368* (2013.01); *H01L 21/77* (2013.01); *H01L 27/12* (2013.01);
(Continued)

(58) Field of Classification Search
CPC ... H01L 27/156; H01L 27/12; H01L 27/1214; H01L 29/78633; H01L 29/66765; H01L 29/417
See application file for complete search history.

(56) References Cited

U.S. PATENT DOCUMENTS 6,025,237 A * 2/2000 Choi .................... H01L 21/7624
257/335
2009/0290083 A1 11/2009 Lim et al.
2017/0062580 A1* 3/2017 Hayashi .............. H01L 29/4908

FOREIGN PATENT DOCUMENTS

CN 102116977 A 7/2011
CN 103199060 A 7/2013
(Continued)

OTHER PUBLICATIONS

International Search Report dated Dec. 23, 2015 corresponding to International application No. PCT/CN2015/084438.
(Continued)

*Primary Examiner* — Kyoung Lee
*Assistant Examiner* — Christina Sylvia
(74) *Attorney, Agent, or Firm* — Nath, Goldberg & Meyer; Joshua B. Goldberg

(57) ABSTRACT

The present invention provides a display substrate and a manufacturing method thereof. The display substrate of the present invention comprises a first structure and a second structure; wherein, the second structure is provided with a lap portion disposed on the first structure and a main body portion connected with the lap portion and outside the first structure; the first structure has a thinned region connected
(Continued)

to an edge thereof, and a thickness of the first structure in the thinned region is smaller than that outside the thinned region; and at least part of the lap portion is located on the thinned region, and at least part of the main body portion outside the thinned region is in direct connection with the part of the lap portion on the thinned region.

16 Claims, 4 Drawing Sheets

(51) Int. Cl.
    *H01L 21/77*         (2017.01)
    *H01L 27/12*         (2006.01)
    *H01L 29/786*       (2006.01)

(52) U.S. Cl.
    CPC .... *H01L 27/1244* (2013.01); *H01L 29/41733* (2013.01); *H01L 29/78696* (2013.01); *G02F 2201/123* (2013.01)

(56) References Cited

FOREIGN PATENT DOCUMENTS

| | | | |
|---|---|---|---|
| CN | 103278979 A | | 9/2013 |
| CN | 102116977 B | * | 5/2015 |
| CN | 104733473 A | | 6/2015 |
| CN | 204407332 U | | 6/2015 |
| JP | 2007165774 A | | 6/2007 |

OTHER PUBLICATIONS

Written Opinion of the International Searching Authority dated Dec. 23, 2015 corresponding to International Application No. PCT/CN2015/084438.

* cited by examiner

DISPLAY SUBSTRATE AND MANUFACTURING METHOD THEREOF

This is a National Phase Application filed under 35 U.S.C. 371 as a national stage of PCT/CN2015/084438 filed on Jul. 20, 2015, an application claiming the benefit of Chinese Application No. 201510112481.X filed on Mar. 13, 2015, the content of each of which is hereby incorporated by reference in its entirety.

FIELD OF THE INVENTION

The present invention belongs to the field of display substrate technology, and particularly relates to a display substrate and a manufacturing method thereof.

BACKGROUND OF THE INVENTION

In an advanced super dimension switch (ADS) mode array substrate, an active region and source/drain may be formed in one patterning process in order to simplify manufacturing process. In this case, a pixel electrode is arranged on the source/drain, that is, the pixel electrode "laps" over the drain.

As shown in FIG. 1, in general, a drain 41, as well as a source 42, has a relatively large thickness of about hundreds of microns, while a pixel electrode 5 has a relatively small thickness of tens of microns. Therefore, in the case that the edge of the drain 41 has a relatively large slope angle (90 degrees in the figure, for example), a part (lap portion 51) of the pixel electrode 5 which "laps" over the drain 41 is very likely to disconnect from a part (main body portion 52) of the pixel electrode 5 beyond the drain 41 at the edge of the drain 41 (i.e., at the joint between the lap portion 51 and the main body portion 52), thus affecting the function of the array substrate. Needless to say, the array substrate may further include therein other known structures such as a base 9, a gate 1, a gate insulation layer 2, an active region 3, a planarization layer 6, a common electrode 7, and the like, which are not described repeatedly here.

SUMMARY OF THE INVENTION

In view of the problem that a pixel electrode in an existing array substrate is prone to breaking at the edge of a drain, the present invention provides a display substrate and a manufacturing method thereof, in which breakage is unlikely to occur.

A technical solution used for solving the technical problem of the present invention is a display substrate which comprises a first structure and a second structure; wherein, the second structure is provided with a lap portion disposed on the first structure, and a main body portion disposed outside the first structure and connected with the lap portion;

the first structure has a thinned region connected to an edge thereof, and a thickness of the first structure in the thinned region is smaller than that outside the thinned region; and at least part of the lap portion is located on the thinned region, and at least part of the main body portion outside the thinned region is in direct connection with the part of the lap portion on the thinned region.

Preferably, the display substrate is an array substrate, the first structure is a drain of a thin film transistor, and the second structure is a pixel electrode.

Further preferably, the drain is entirely disposed on an active region.

Preferably, the display substrate further comprises a base, and a distance between the first structure and the base is larger than or equal to that between the main body portion of the second structure and the base.

Preferably, the lap portion covers the entire thinned region.

Preferably, a part, which is covered by the lap portion, of the thinned region comprises a plurality of sub-thinned regions, and the first structure in a sub-thinned region closer to the edge thereof has a smaller thickness.

Preferably, the thickness of the first structure in the thinned region is a half to two thirds of that of the first structure outside the thinned region.

Preferably, a technical solution used for solving the technical problem of the present invention is a manufacturing method of the above display substrate, which comprises:

step 1: forming a first structure such that the first structure has a thinned region adjacent to an edge thereof; and step 2: forming a second structure such that the second structure has a lap portion disposed on the first structure and a main body portion disposed outside the first structure and connected with the lap portion, wherein at least part of the lap portion is located on the thinned region; and at least part of the main body portion outside the thinned region is in direct connection with the part of the lap portion on the thinned region.

Preferably, forming the first structure in the step 1 comprises: covering with a photoresist and performing dry etching so that the first structure is provided with the thinned region adjacent to the edge thereof.

Preferably, in the step 1, the first structure is formed by stepwise exposure in one patterning process so that the first structure is provided with the thinned region adjacent to the edge thereof.

Preferably, the display substrate is an array substrate, the first structure is a drain of a thin film transistor, and the second structure is a pixel electrode.

Further preferably, in the step 1, an active region of the thin film transistor is formed at the same time and the drain is entirely disposed on the active region.

Further preferably, the step 1 comprises: sequentially forming a semiconductor layer, a source-drain metal layer and a photoresist layer on a base; performing stepwise exposure and development on the photoresist layer so that the photoresist layer has a first thickness in a first region, has a second thickness in a second region, has a third thickness in a third region, and does not remain in the other region; wherein, the first region corresponds to an area of the active region which is conductive when the thin film transistor is turned on, the second region corresponds at least to the thinned region of the drain, and the third region corresponds at least to an area of the active region other than the first region and the second region, the first thickness is smaller than the second thickness, and the second thickness is smaller than the third thickness; removing parts of the source-drain metal layer and the semiconductor layer which are not covered by the photoresist, so as to form the active region; performing ashing on the photoresist layer, so as to remove the photoresist layer in the first region, and preserve parts of the photoresist layer in the second region and the third region; removing the source-drain metal layer in the first region, so as to form a source and the drain; performing ashing on the photoresist layer to remove the photoresist layer in the second region and preserve a part of the photoresist layer in the third region; thinning the source-drain metal layer in the second region to form the thinned region; and removing the photoresist layer in the third region.

Preferably, the thinned region formed in the step 1 comprises a plurality of sub-thinned regions which are thinned to different degrees in different regions, so that a sub-thinned region closer to the edge of the first structure is thinned to a larger degree; and the lap portion formed in the step 2 covers the plurality of sub-thinned regions.

It can be seen that, the first structure of the display substrate of the present invention is provided with a thinned region, that is, the first structure is "step-like", the top of the "step" has a normal thickness, which can ensure realization of function of the first structure itself, while the second structure "laps" over the thinned region of the first structure (i.e., a lower part of the "step"). In this way, a height difference between the lap portion and the main body portion of the second structure is relatively small, and therefore breakage is unlikely to occur between the lap portion and the main body portion, which better ensures performance of the display substrate.

Figure 1:
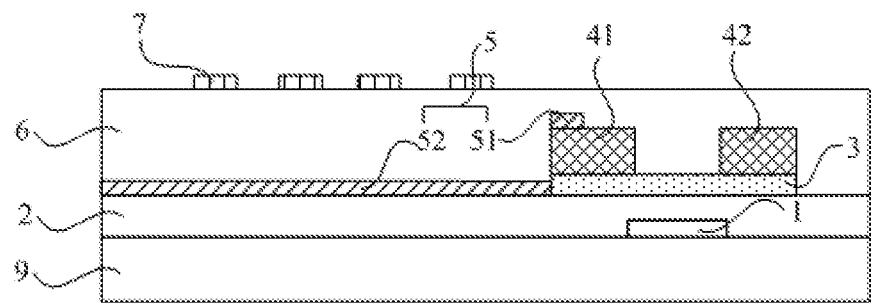
FIG. 1 is a sectional view illustrating that breakage occurs to a pixel electrode in an existing array substrate.

REFERENCE NUMERALS 1, gate; 2, gate insulation layer; 3, active region; 39, semiconductor layer; 41, drain; 411, thinned region; 42, source; 49, source-drain metal layer; 5, pixel electrode; 51, lap portion; 52, main body portion; 6, planarization layer; 7, common electrode; 8, photoresist layer; 9, base; Q1, first region; Q2, second region; Q3, third region.

DETAILED DESCRIPTION OF THE EMBODIMENTS

To enable those skilled in the art to better understand the technical solutions of the present invention, the present invention will be further described in detail below in conjunction with the accompanying drawings and the specific implementations.

Embodiment 1

Figure 2:
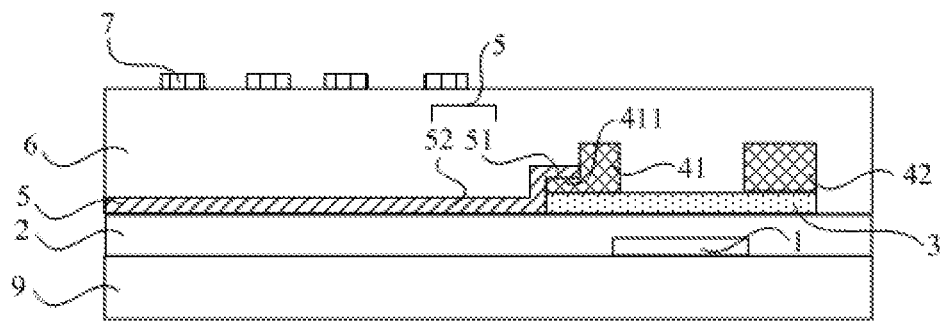
FIG. 2 is a sectional view of an array substrate according to an embodiment of the present invention.

As shown in FIG. 2, this embodiment provides a display substrate comprising a first structure and a second structure; the second structure is provided with a lap portion 51 disposed on the first structure, and a main body portion 52 disposed outside the first structure and connected with the lap portion 51.

The first structure has a thinned region 411 at the edge portion thereof, and a thickness of the first structure in the thinned region 411 is smaller than that of the first structure outside the thinned region 411.

At least part of the lap portion 51 is located on the thinned region 411; and at least part of the main body portion 52 outside the thinned region 411 is in direct connection with the part of the lap portion 51 on the thinned region 411.

The display substrate of this embodiment may be a substrate used in a liquid crystal display device, an organic light emitting diode (OLED) display device, or the like, and may be an array substrate, a color filter substrate, an opposite substrate, or the like. The display substrate includes the first structure and the second structure disposed in different layers. In the first structure, a part (thinned region 411) of the first structure has a relatively small thickness, and is connected with the edge of the first structure, i.e., the thinned region 411, instead of being entirely located in the middle of the first structure and surrounded by the non-thinned region, has an edge which at least partially overlaps the edge of the first structure. In the second structure, a part (lap portion 51) of the second structure is disposed on the thinned region 411, and the other part (main body portion 52) thereof is disposed outside the thinned region 411. Moreover, at least part of the main body portion 52 is in direct connection with the portion of the lap portion 52 on the thinned region 411. In this way, when the main body portion 52 of the second structure is connected with the lap portion 51 thereof, since at least part of the lap portion 51 is disposed on the thinned region 411, a height difference between said part of the lap portion 51 and the main body portion 52 can be decreased at least, reliable connection is ensured, and breakage is unlikely to occur.

It can be seen that, the first structure of the display substrate of this embodiment is provided with a thinned region 411, that is, the first structure is "step-like", the top of the first structure has a normal thickness, which can ensure realization of function of the first structure itself, while the second structure "laps" over the thinned region 411 of the first structure (i.e., a lower part of the "step"). In this way, a height difference (level difference) between the lap portion 51 and the main body portion 52 of the second structure is relatively small, and therefore breakage is unlikely to occur between the lap portion 51 and the main body portion 52, which can better ensure performance of the display substrate.

Preferably, the display substrate of this embodiment is an array substrate, the first structure is a drain 41 of a thin film transistor, and the second structure is a pixel electrode 5.

In other words, the display substrate of this embodiment is preferably an array substrate (more particularly, an array substrate used in a liquid crystal display device), the first structure therein is a drain 41 of a thin film transistor, and the second structure is a pixel electrode 5. This is because since a thickness of the drain 41 is generally far larger than that of the pixel electrode 5, the pixel electrode 5 is very likely to break when lapping over the drain 41, and thus is quite applicable to the present invention.

The following description of this embodiment is given by taking the case that the first structure is a drain 41 of a thin film transistor and the second structure is a pixel electrode 5 as an example. However, it should be understood that the present invention is not limited thereto, and the present invention can be used in a display substrate of any type, as long as there is a case that one structure laps over another structure. For example, if a part of a source 42 and/or a drain 41 of a thin film transistor is disposed on an active region 3, and the other part thereof is disposed outside the active region 3, the active region 3 may be taken as the first structure and the drain 41 and/or the source 42 may be taken as the second structure.

Preferably, the drain 41 is entirely disposed on the active region 3.

In other words, preferably, the drain 41 is entirely disposed on the active region 3, and no part thereof is disposed outside the active region 3. This is because the drain 41 with such structure and the active region 3 can be simultaneously formed in one patterning process and the manufacturing process is thus simple.

Here, the above array substrate may be an advanced super dimension switch (ADS) mode array substrate.

In other words, a planarization layer 6 (or passivation layer) is further provided on the pixel electrode 5 of the array substrate, and a common electrode 7, which is formed as a slit electrode, is provided on the planarization layer 6. Apparently, the array substrate may also be of other type, such as twisted nematic (TN) mode, in-plane switching (IPS) mode, or the like.

Preferably, the display substrate further comprises a base 9, and a distance between the first structure and the base 9 is larger than or equal to that between the main body portion 52 of the second structure and the base 9.

That is to say, a position, relative to the base 9, of the above first structure (the drain 41) should be higher than (at least flush with) that of the main body portion 52 of the second structure (the pixel electrode 5). For example, as shown in FIG. 2, the main body portion 52 of the pixel electrode 5 (the second structure) is disposed directly on a gate insulation layer 2, the drain 41 (the first structure) is disposed on the active region 3, the active region 3 is disposed on the gate insulation layer 2, and therefore, the drain 41 (the first structure) is higher than the main body portion of the pixel electrode 5 (the second structure) by a thickness of the active region 3. In this case, the height difference between the main body portion 52 and the lap portion 51 of the second structure is larger, breakage is more likely to occur, and thus it is more necessary to apply the present invention.

Preferably, a thickness of the first structure in the thinned region 411 is a half to two thirds of that of the first structure outside the thinned region 411.

In other words, if the maximum thickness of the first structure (the thickness of the first structure outside the thinned region 411) is 1, the thickness of the first structure in the thinned region 411 ranges from ½ to ⅔, i.e., a thickness of the portion that is removed for thinning ranges from ⅓ to ½. Such thickness difference is generally enough to avoid breakage of the second structure (the pixel electrode 5).

Preferably, the lap portion 51 covers the entire thinned region 411.

In other words, the lap portion 51 of the second structure (the pixel electrode 5) may completely cover the thinned region 411 of the first structure (the drain 41) (actually may extend beyond the thinned region 411), so as to increase contact area therebetween and reduce contact resistance. Needless to say, the lap portion 51 may cover only a part of the thinned region 411. It should be noted that the size of the thinned region 411 may be set according to the process, as long as reliable connection can be ensured, and detailed description thereof will not be given herein.

Preferably, the part, which is covered by the lap portion 51, of the thinned region 411 comprises a plurality of sub-thinned regions, and the first structure in a sub-thinned region closer to the edge of the first structure (the drain 41) has a smaller thickness.

That is to say, the thinned region 411 may be divided into multiple levels, or the thinned region 411 may be divided into multiple "steps", and the closer to the edge of the first structure (the drain 41) a level or step is, the smaller thickness it has. In this way, the second structure (the pixel electrode 5) can be better prevented from breaking in the thinned region 411.

As shown in FIGS. 2 to 11, this embodiment further provides a manufacturing method of the above display substrate, which comprises:

step 1: forming a first structure such that the first structure has a thinned region 411 adjacent to the edge thereof; and step 2: forming a second structure such that the second structure has a lap portion 51 disposed on the first structure and a main body portion 52 disposed outside the first structure and connected with the lap portion 51, wherein at least part of the lap portion 51 is disposed on the thinned region 411; and at least part of the main body portion 52 outside the thinned region is in direct connection with the part of the lap portion 51 disposed on the thinned region.

It can be seen that, to manufacture the above display substrate, the first structure provided with the thinned region 411 may be formed first, and then the second structure at least partially covering the thinned region 411 may be formed.

Preferably, forming the first structure in step 1 comprises: covering with a photoresist and performing dry etching so that the first structure is provided with the thinned region adjacent to the edge thereof.

In other words, the first structure with the thinned region may be formed by dry etching process. The dry etching is a technique of etching a structure with corrosive gas. Since the dry etching generally has a slow etch rate and can be controlled easily, it can be used for removing material with a specific thickness so that the first structure is provided with the thinned region 411. Needless to say, the way of forming the thinned region 411 is not limited thereto, for example, if the first structure is made from a photosensitive material, different degrees of exposure may be performed on the material at a position corresponding to the thinned region 411 and the material at a position corresponding to the non-thinned region, so as to form the thinned region 411.

Preferably, in step 1, the first structure may be formed by stepwise exposure in one patterning process so that the first structure is provided with the thinned region adjacent to the edge thereof.

In other words, a photoresist layer 8 may be formed to have different thicknesses at different positions by stepwise exposure, so that the non-thinned region of the first structure is formed first by etching after one exposure, and subsequently the thinned region 411 is formed by further etching.

Preferably, the display substrate is an array substrate, the first structure is a drain 41 of a thin film transistor, and the second structure is a pixel electrode 5. Further preferably, the active region 3 and the drain 41 (the first structure) are formed simultaneously in step 1, and the drain 41 is entirely disposed on the active region 3.

In other words, the method of this embodiment is preferably used for manufacturing the above array substrate. Specifically, a manufacturing method of the array substrate will be described in detail below. The manufacturing method of the array substrate comprises the steps as follows.

At step 101, a gate 1, a gate line, and a gate insulation layer 2 are sequentially formed on a base 9 by a patterning process.

Figure 3:
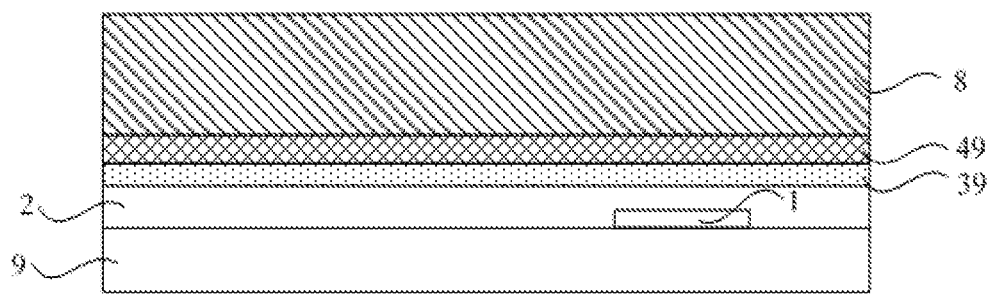
FIG. 3 is a sectional view of a structure obtained after forming a photoresist layer in a manufacturing method of an array substrate according to an embodiment of the present invention.
Figure 4:
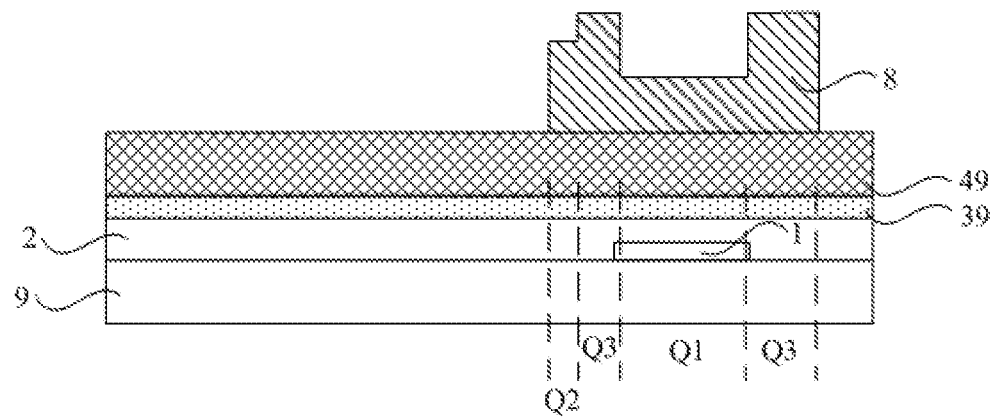
FIG. 4 is a sectional view of a structure obtained after exposing and developing the photoresist layer in a stepped manner in the manufacturing method of an array substrate according to the embodiment of the present invention.

In other words, conventional structures such as the gate 1, the gate line, the gate insulation layer 2, and the like are formed on the base 9 by a conventional patterning process, as shown in FIG. 3. Needless to say, in this step, other known structures such as a buffer layer and the like may also be formed (before the gate 1 is formed), which are not described in detail here.

At step 102, a semiconductor layer 39, a source-drain metal layer 49 and a photoresist layer 8 are sequentially formed on the base 9 after step 101.

In other words, the semiconductor layer 39, the source-drain metal layer 49 and the photoresist layer 8 are sequentially formed on the gate insulation layer 2 by a conventional method (deposition or coating), and a structure shown in FIG. 3 is obtained.

Here, the source-drain metal layer 19 may be made of a metal such as molybdenum, niobium, tungsten, titanium, or the like, or an alloy of any two or more thereof, and have a thickness of several hundreds of microns.

At step 103, stepwise exposure and development are performed on the photoresist layer 8 so that the photoresist layer 8 has a first thickness in a first region Q1, has a second thickness in a second region Q2, has a third thickness in a third region Q3, and does not remain in the other region. Here, the first region Q1 corresponds to an area of the active region 3 which is conductive when the thin film transistor is turned on, the second region Q2 corresponds at least to the thinned region 411 of the drain 41, and the third region Q3 corresponds at least to an area of the active region 3 other than the first region Q1 and the second region Q2. Moreover, the first thickness is smaller than the second thickness, and the second thickness is smaller than the third thickness.

Namely, different degrees of exposure are performed on different parts of the photoresist layer 8 (e.g., with a grayscale mask), and accordingly, the photoresist layer 8 has different thicknesses at different positions after being developed. In the structure shown in FIG. 4, in the area (i.e., "channel") of the active region 3 which is conductive when the thin film transistor is turned on, the photoresist layer 8 has the smallest thickness (i.e., the first thickness); at a position for forming the thinned region 411 of the drain 41, the photoresist layer 8 has a medium thickness (i.e., the second thickness); at other positions (non-thinned region of the source 42 and the drain 41) of the active region 3, the photoresist layer 8 has the largest thickness (i.e., the third thickness); and at positions outside the active region 3, the photoresist layer 8 does not remain.

Here, if a data line and the source 42 are formed simultaneously, the photoresist layer 8 may also has the third thickness at a position corresponding to the data line, i.e., the third region Q3 may further comprise an area corresponding to the data line.

At step 104, parts of the source-drain metal layer 49 and the semiconductor layer 39, which are not covered by the photoresist, are removed to form the active region 3.

Figure 5:
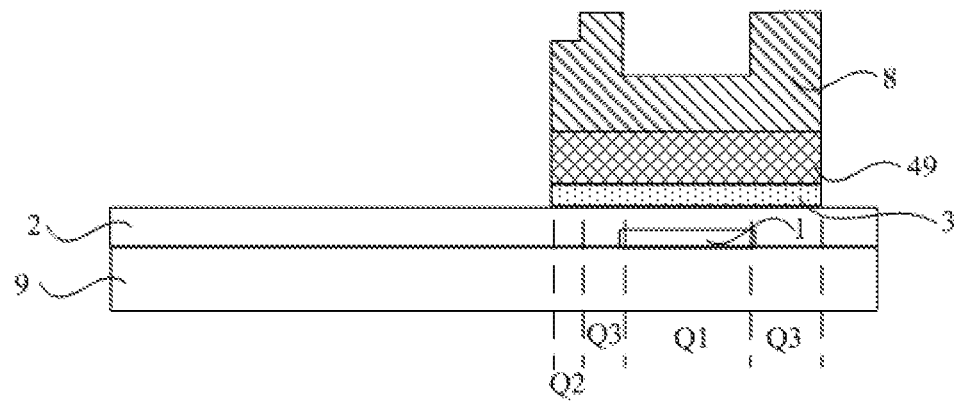
FIG. 5 is a sectional view of a structure obtained after forming an active region in the manufacturing method of an array substrate according to the embodiment of the present invention.

In other words, parts of the source-drain metal layer 49 and the semiconductor layer 39, which are not covered by the photoresist, are removed by etching (e.g., with different etchants, respectively), namely, parts of the source-drain metal layer 49 and the semiconductor layer 39 outside the active region 3 (and other than the data line, in the case of forming the data line simultaneously) are removed, so that the remaining semiconductor layer forms the active region 3, and the active region 3 is covered by the source-drain metal layer 49, thus obtaining the structure shown in FIG. 5.

At step 105, ashing is performed on the photoresist layer 8, so as to remove the photoresist layer 8 in the first region Q1, and preserve parts of the photoresist layer 8 in the second region Q2 and the third region Q3.

Figure 6:
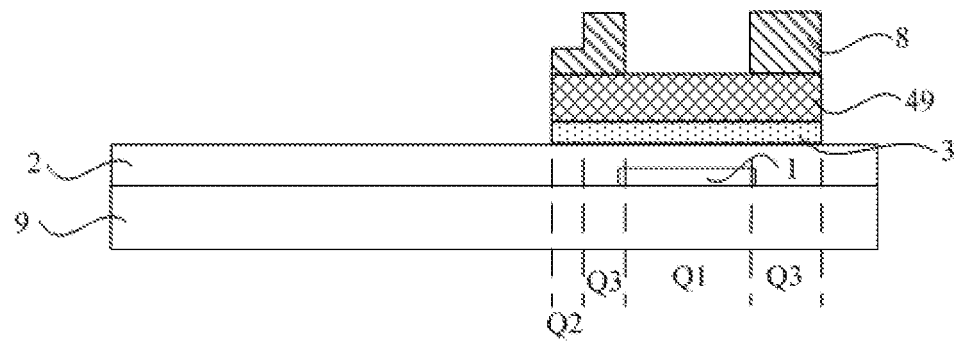
FIG. 6 is a sectional view of a structure obtained after performing a first ashing process on the photoresist layer in the manufacturing method of an array substrate according to the embodiment of the present invention.

In other words, the photoresist layer 8 is thinned by an ashing process, and needs to be thinned by the first thickness at least, so that the photoresist layer 8, having the first thickness, in the first region Q1 (channel) is removed completely, and the photoresist layer 8 retains a certain thickness in the second region Q2 and the third region Q3, thus obtaining the structure shown in FIG. 6.

Needless to say, in the ashing process of the photoresist layer 8, the actual area of the photoresist layer 8 might be reduced slightly, which will not be considered since it belongs to inevitable error caused in the process.

At step 106, the source-drain metal layer 49 in the first region Q1 is removed, so as to form the source 42 and the drain 41.

Figure 7:
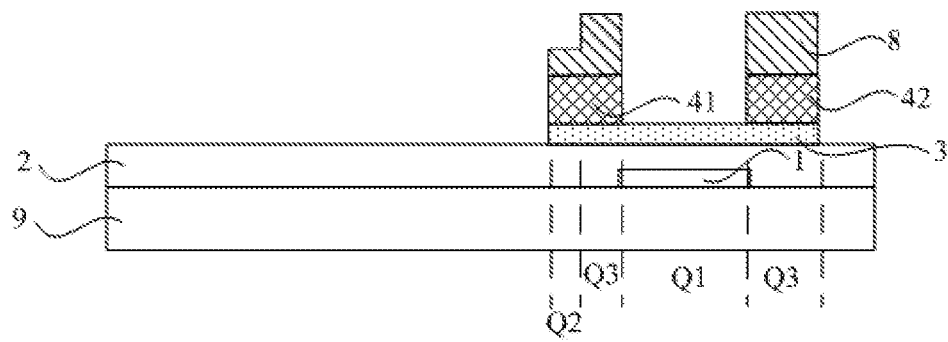
FIG. 7 is a sectional view of a structure obtained after forming a source and a drain in the manufacturing method of an array substrate according to the embodiment of the present invention.

At this time, the photoresist layer 8 does not remain in the first region Q1 (channel) any more, and therefore the source-drain metal layer 49 in this region may be removed by etching so as to form the source 42 and the drain 41 separated from each other, thus obtaining the structure shown in FIG. 7.

At step 107, ashing is performed on the photoresist layer 8 to remove the photoresist layer 8 in the second region Q2 and preserve a part of the photoresist layer 8 in the third region Q3.

Figure 8:
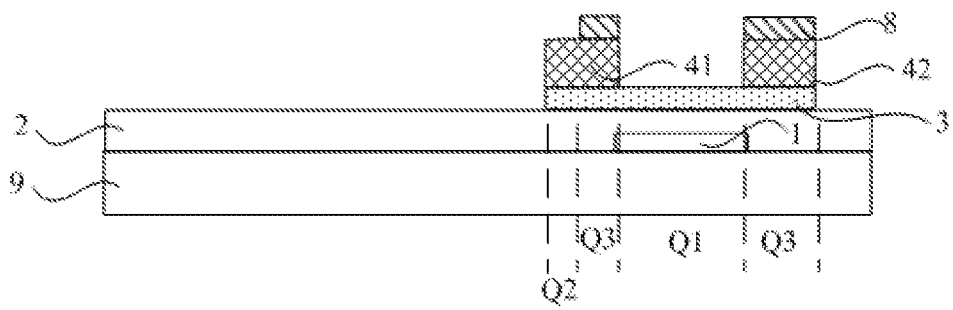
FIG. 8 is a sectional view of a structure obtained after performing a second ashing process on the photoresist layer in the manufacturing method of an array substrate according to the embodiment of the present invention.

In other words, the photoresist layer 8 is further thinned by an ashing process, and needs to be thinned until the photoresist layer 8 in the second region Q2 is removed completely and the photoresist layer 8 in the third region Q3 retains a certain thickness, thus obtaining the structure shown in FIG. 8.

At step 108, the source-drain metal layer 49 in the second region Q2 is thinned to form the thinned region 411.

Figure 9:
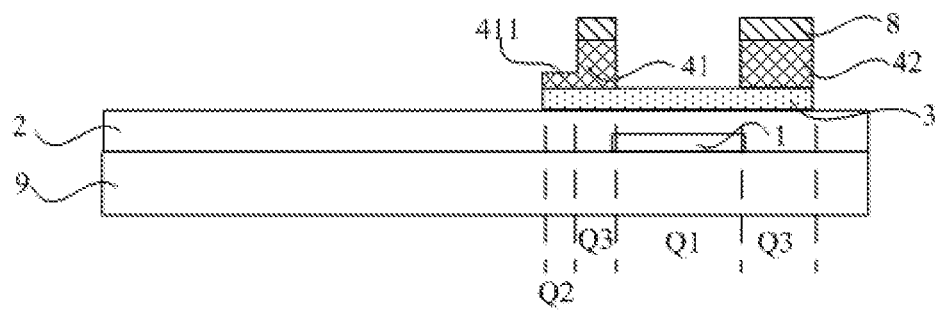
FIG. 9 is a sectional view of a structure obtained after forming a thinned region in the manufacturing method of an array substrate according to the embodiment of the present invention.

At this time, the source-drain metal layer 49 in the second region Q2 (the thinned region 411) is exposed, and thus can be thinned to form the above thinned region 411 by a dry etching process, and the structure shown in FIG. 9 is obtained. Here, process gases, process parameters, and the like used in the thinning may be adjusted by a person skilled in the art as needed. For example, when an object to be thinned is a metal with a thickness of several hundred microns, chlorine gas with a concentration of 99% may be taken as the process gas (other components may be protective gases such as nitrogen gas and the like), and etching time may range from 20 to 40 seconds, for example, 30 seconds; according to the above etching parameters, the thinned region 411, having a thickness as large as a half to one third of the thickness before thinning, of the drain 41 may be obtained.

Preferably, in this step, the thinned region 411, in which different areas are thinned to different degrees, is obtained, so that an area closer to the edge of the drain 41 (the first structure) is thinned to a larger degree. In this way, the formed thinned region 411 is divided into a plurality of sub-thinned regions, and the above structure with sub-thinned regions can be obtained.

Specifically, the above structure in which the thinned region 411 is divided into a plurality of sub-thinned regions may be achieved by dividing the photoresist layer 8 in the second region Q2 to have a plurality of different thicknesses. In this case, the photoresist layer 8, having the smallest thickness, in the second region Q2 may be removed first so as to expose and thin a part of the region; afterwards, the photoresist layer 8, having a slightly larger thickness, in the second region Q2 may be removed so as to expose and thin the corresponding area (undoubtedly, the area previously exposed is further thinned as well). In this way, the thinned region 411, which is thinned to different degrees at different positions, may be formed, that is, the plurality of sub-thinned regions of the thinned region 411 is formed.

Needless to say, it should be note that the etching parameters need to be adjusted when the sub-thinned regions are to be formed. For example, an area exposed firstly will also be etched during the etching of subsequently exposed areas, which should be taken into consideration when selecting etching parameters, but the specific implementation thereof may be selected by a person skilled in the art as required, and thus will not described in detail herein.

At step 109, the photoresist layer 8 in the third region Q3 is removed.

Figure 10:
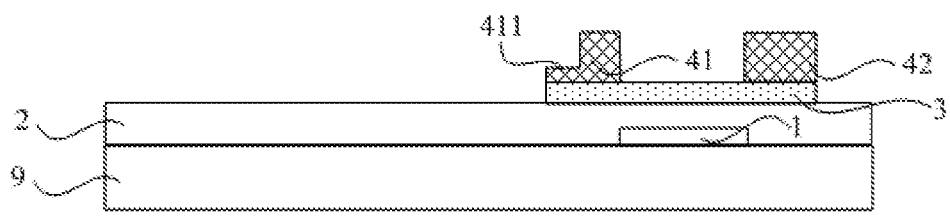
FIG. 10 is a sectional view of a structure obtained after stripping away the photoresist layer in the manufacturing method of an array substrate according to the embodiment of the present invention.

That is to say, the finally remaining photoresist layer 8 is stripped off so as to obtain the structure shown in FIG. 10, which includes the drain 41 provided with the thinned region 411.

At step 110, a pattern including a pixel electrode 5 (the second structure) is formed by a patterning process.

Figure 11:
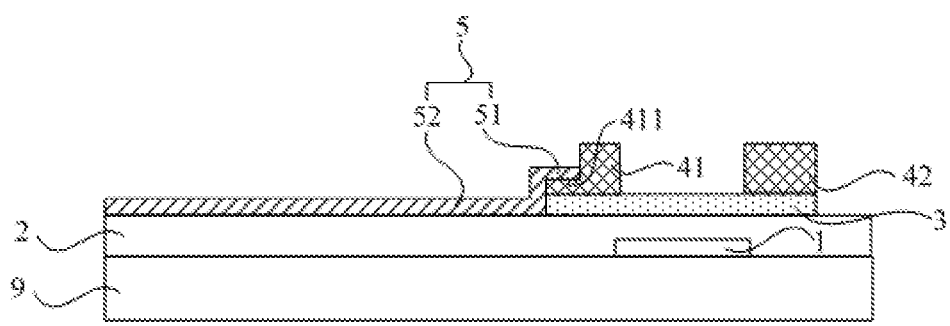
FIG. 11 is sectional view of a structure obtained after forming a pixel electrode in the manufacturing method of an array substrate according to the embodiment of the present invention.

In other words, following the above steps, the pixel electrode 5 is formed by a conventional method such that the pixel electrode 5 is provided with a lap portion 51 covering the thinned region 411 of the drain 41 and a main body portion 52 outside the thinned region 411, thereby obtaining the structure shown in FIG. 11 (which is depicted by taking the case that the lap portion 51 exactly covers the entire thinned region 411)

In this way, when the thinned region 411 is divided into a plurality of sub-thinned regions, the formed lap portion 51 may cover the plurality of sub-thinned regions so as to better weaken the influence of height difference.

At step 111, optionally, a planarization layer 6 and a common electrode 7 are formed sequentially.

In other words, following the above steps, other known structures such as the planarization layer 6, the common electrode 7, and the like are prepared to obtain an ADS mode array substrate with the structure shown in FIG. 2.

Needless to say, it should be understood that, the above manufacturing method of the array substrate may have many modifications. For example, the thin film transistor may be of top gate type, that is, the gate insulation layer 2 and the gate 1 (gate line) may be formed after the active region 3 is formed. As another example, the array substrate may be of TN mode, and in this case, there is no need to further form the common electrode 7 after the pixel electrode 5 is formed. As still another example, the source 42 and the drain 41 may not be formed in the same patterning process as the active region 3, that is, the active region 3 may be formed first, and then the source 42 and the drain 41 are formed (accordingly, the source 42 and the drain 41 are not necessarily disposed on the active region 3 only). As still another example, if the active region 3 is made from a metal oxide semiconductor, the manufacturing method thereof may further comprise other known steps such as a step of forming an etch stop layer (ESL), and the like.

It should be understood that, the above implementations are merely exemplary implementations used for explaining the principle of the present invention, but the present invention is not limited thereto. For those skilled in the art, various modifications and improvements may be made without departing from the spirit and essence of the present invention, and these modifications and improvements are also deemed as falling within the protection scope of the present invention.

The invention claimed is:

1. A display substrate, comprising a first structure and a second structure; wherein, the second structure is provided with a lap portion disposed on the first structure, and a main body portion disposed outside the first structure and connected with the lap portion;
   the first structure has a thinned region connected to an edge thereof, and a thickness of the first structure in the thinned region is smaller than that of the first structure outside the thinned region; and
   at least part of the lap portion is located on the thinned region, and at least part of the main body portion outside the thinned region is in direct connection with the part of the lap portion on the thinned region,
   wherein, a part, which is covered by the lap portion, of the thinned region comprises a plurality of sub-thinned regions, and the first structure in a sub-thinned region closer to the edge thereof has a smaller thickness.

2. The display substrate according to claim 1, wherein, the display substrate is an array substrate, the first structure is a drain of a thin film transistor, and the second structure is a pixel electrode.

3. The display substrate according to claim 2, wherein, the drain is entirely disposed on an active region.

4. The display substrate according to claim 3, wherein, the lap portion covers the entire thinned region.

5. The display substrate according to claim 3, wherein, the thickness of the first structure in the thinned region is a half to two thirds of that of the first structure outside the thinned region.

6. The display substrate according to claim 2, wherein, the lap portion covers the entire thinned region.

7. The display substrate according to claim 2, wherein, the thickness of the first structure in the thinned region is a half to two thirds of that of the first structure outside the thinned region.

8. The display substrate according to claim 1, wherein, the display substrate further comprises a base, and a distance between the first structure and the base is larger than or equal to that between the main body portion of the second structure and the base.

9. The display substrate according to claim 1, wherein, the lap portion covers the entire thinned region.

10. The display substrate according to claim 1, wherein, the thickness of the first structure in the thinned region is a half to two thirds of that of the first structure outside the thinned region.

11. A manufacturing method of a display substrate, comprising:
step 1: forming a first structure such that the first structure has a thinned region adjacent to an edge thereof, and
step 2: forming a second structure such that the second structure has a lap portion disposed on the first structure and a main body portion disposed outside the first structure and connected with the lap portion, wherein at least part of the lap portion is located on the thinned region; and at least part of the main body portion outside the thinned region is in direct connection with the part of the lap portion on the thinned region,
wherein, the thinned region formed in step 1 comprises a plurality of sub-thinned regions which are thinned to different degrees in different regions, so that a sub-thinned region closer to the edge of the first structure is thinned to a larger degree; and
the lap portion formed in the step 2 covers the plurality of sub-thinned regions.

12. The manufacturing method according to claim 11, wherein, forming the first structure in the step 1 comprises:
covering with a photoresist and performing dry etching so that the first structure is provided with the thinned region adjacent to the edge thereof.

13. The manufacturing method according to claim 11, wherein,
in the step 1, the first structure is formed by stepwise exposure in one patterning process so that the first structure is provided with the thinned region adjacent to the edge thereof.

14. The manufacturing method according to claim 11, wherein,
the display substrate is an array substrate, the first structure is a drain of a thin film transistor, and the second structure is a pixel electrode.

15. The manufacturing method according to claim 14, wherein,
in the step 1, an active region of the thin film transistor is also formed at the same time and the drain is entirely disposed on the active region.

16. A manufacturing method of a display substrate, comprising:
step 1: forming a first structure such that the first structure has a thinned region adjacent to an edge thereof; and
step 2: forming a second structure such that the second structure has a lap portion disposed on the first structure and a main body portion disposed outside the first structure and connected with the lap portion, wherein at least part of the lap portion is located on the thinned region; and at least part of the main body portion outside the thinned region is in direct connection with the part of the lap portion on the thinned region,
wherein, the display substrate is an array substrate, the first structure is a drain of a thin film transistor, and the second structure is a pixel electrode,
wherein, in the step 1, an active region of the thin film transistor is also formed at the same time and the drain is entirely disposed on the active region,
wherein, the step 1 comprises:
sequentially forming a semiconductor layer, a source-drain metal layer and a photoresist layer on a base;
performing stepwise exposure and development on the photoresist layer so that the photoresist layer has a first thickness in a first region, has a second thickness in a second region, has a third thickness in a third region, and does not remain in the remaining region; wherein, the first region corresponds to an area of the active region which is conductive when the thin film transistor is turned on, the second region corresponds at least to the thinned region of the drain, and the third region corresponds at least to an area of the active region other than the first region and the second region, the first thickness is smaller than the second thickness, and the second thickness is smaller than the third thickness;
removing parts of the source-drain metal layer and the semiconductor layer which are not covered by the photoresist, so as to form the active region;
performing ashing on the photoresist layer, so as to remove the photoresist layer in the first region, and preserve parts of the photoresist layer in the second region and the third region;
removing the source-drain metal layer in the first region, so as to form a source and the drain;
performing ashing on the photoresist layer to remove the photoresist layer in the second region and preserve a part of the photoresist layer in the third region;
thinning the source-drain metal layer in the second region to form the thinned region; and
removing the photoresist layer in the third region.

* * * * *